(12) United States Patent
Lecohier et al.

(10) Patent No.: US 6,951,772 B2
(45) Date of Patent: Oct. 4, 2005

(54) PROCESS FOR PROTECTION OF THE SURFACE OF A FIXED CONTACT FOR A SEMICONDUCTOR COLOR IMAGE SENSOR CELL DURING A COLORING PROCESS

(75) Inventors: Baudoin Lecohier, Saint Maximin la Sainte Beaume (FR); Brendan Dunne, Gardanne (FR)

(73) Assignee: STMicroelectronics SA, Montrouge (FR)

( * ) Notice: Subject to any disclaimer, the term of this patent is extended or adjusted under 35 U.S.C. 154(b) by 60 days.

(21) Appl. No.: 10/739,871

(22) Filed: Dec. 18, 2003

(65) Prior Publication Data

US 2004/0185598 A1 Sep. 23, 2004

(30) Foreign Application Priority Data

Dec. 18, 2002 (FR) .............................. 02 16118

(51) Int. Cl.$^7$ ............................... H01L 21/00
(52) U.S. Cl. ........................................... 438/98
(58) Field of Search ............................. 438/57, 59–60, 438/64–66, 69–70, 72, 73, 75, 98

(56) References Cited

U.S. PATENT DOCUMENTS 5,854,091 A 12/1998 Back et al.

6,396,089 B1 5/2002 Lin et al.

OTHER PUBLICATIONS

French Preliminary Search Report dated Aug. 27, 2003 for French Application No. 0216118.

*Primary Examiner*—Evan Pert
(74) *Attorney, Agent, or Firm*—Lisa K. Jorgenson; Jon A. Gibbons; Fleit, Kain, Gibbons, Gutman, Bongini & Bianco P.L.

(57) ABSTRACT

The invention relates to a process for making a semiconductor color image sensor cell comprising a metal layer in which a fixed contact is defined, an anti-reflecting layer covering the metal layer and a passivation layer covering the assembly. The method includes etching the passivation layer and stopping on the anti-reflecting layer so as to form a hole for the opening of the fixed contact; forming at least one colored filter element on a region of the passivation layer, the anti-reflecting layer then acting as a protection layer for the surface of the fixed contact; depositing a planarizing resin layer so as to cover the colored filter elements; forming micro-lenses on the planarizing resin layer above the colored filter elements; and etching the anti-reflecting layer to open the fixed contact.

22 Claims, 2 Drawing Sheets

PROCESS FOR PROTECTION OF THE SURFACE OF A FIXED CONTACT FOR A SEMICONDUCTOR COLOR IMAGE SENSOR CELL DURING A COLORING PROCESS

FIELD OF THE INVENTION

The present invention generally relates to the field of processes used to make a semiconductor color image sensor cell, and more particularly to a process designed to protect the surface of a fixed contact of such a cell during use of a photolithographic coloring process for the definition of colored filter elements of the cell.

BACKGROUND OF THE INVENTION

Color image sensor cells are designed to be integrated into CCD (Charge-Coupled Device) or CMOS type digital cameras, for example cameras installed on portable telephones. The color image sensor cells are designed for coloring images acquired pixel by pixel through colored filter elements. Color image sensor cells comprise a metal level used particularly to form the fixed contacts necessary for the electrical connection of the component with external circuits or to an output from the housing in which it is mounted. The fixed contacts are actually conducting areas, usually square or rectangular that comprise a hole, in which a connection wire can be soldered. Conventionally, pure or doped aluminum is used to make the metal layer in which the fixed contacts are formed for soldering for a wire assembly. The color image sensor cell also comprises colored filter elements formed on a dielectric layer covering the metal level on which the fixed contacts are formed.

FIGS. 1 and 2 illustrate sequences in steps according to prior art used during the formation of a fixed contact and colored filter elements of a color image sensor cell. FIG. 1 thus shows a fixed contact 3 embedded in a passivation layer 1 formed from insulating oxide. An anti-reflecting layer 5, preferably made of titanium nitride TiN is advantageously provided to cover the area of the fixed contact 3. This titanium nitride layer originates from the use of the metal level exposure step particularly for the definition of fixed contacts. At this stage, titanium nitride is used for its optical properties to avoid having parasite reflections during photo exposure of the metal level on which the fixed contacts are defined.

The fixed contact 3 is etched in three steps; one etching step for the passivation layer 1, one etching step for the anti-reflecting layer 5, and one etching step for aluminum 3, called the over etch step, consisting of etching any residues remaining on the aluminum surface after the previous two steps. This sequence of steps results in an opening or hole 4 vertically in line with the fixed contact 3.

FIG. 2 shows the formation of colored filter elements on the passivation layer 1 of the cell. A first colored element 6 is formed by application of a colored resin layer, typically green, and by the formation of a pattern in this colored resin layer using conventional photolithographic exposure and development procedures. Similarly, the second and third colored elements 7 and 8 are defined starting from the deposition of a second layer of colored resin, typically blue, and a third layer of colored resin, typically red.

Conventional steps for the deposition, photolithographic exposure and development of a planarizing resin layer 9 are then applied so as to cover the three colored elements 6, 7 and 8. The three colored resins 6, 7 and 8 each have a different thickness, so that the deposit of the planarizing resin layer 9 covering the colored resins is necessary at this stage to enable the formation of micro-lenses in order to improve the sensitivity of the color image cell.

A step for formation of micro-lenses 10 on the planarizing resin layer 9 above the colored elements 6, 7 and 8 is then applied. This is done by depositing another resin layer called the micro-lens resin, for the formation of micro-lenses 10. The parts of the micro-lens resin layer that cover the regions not covered by colored elements 6, 7 and 8, and particularly the fixed contact, are then insolated and then removed by chemical development. The optical properties of the aluminum in the fixed contact have an incidence on the reflection of light during the step in which the micro-lens resin is insolated, therefore a strong exposure dose is necessary so as to completely develop the part of the micro-lens resin located above the fixed contact. The layer of micro-lens resin to be removed is exposed twice in order to avoid degrading the final dimensions of the micro-lenses 10 by an excessively long photo.

Thus, in a first exposure step of the micro-lens resin, a first mask is used so as to only insolate (i.e. expose) the part of the micro-lens resin located above the fixed contact, and a second mask is used in a second exposure step so as to insolate all parts of the micro-lens resin layer that will be removed for formation of the micro-lenses themselves. All that remains after a step in which the insolated resin parts are developed, are the resin contacts located above each of the colored elements 6, 7 and 8. Finally, a baking step is applied to make the resin contacts convex to form the micro-lenses 10.

The two-step exposure that overexposes only the micro-lens resin area located above the fixed contact provides a means of being sure that the area is sufficiently insolated so that it can be removed in its entirety. However, this is not advantageous in terms of manufacturing cost.

A final step called the "descum" step is then necessary, that consists of cleaning the surface of the fixed contact 3 with an oxygen plasma, so as to strip the surface of the fixed contact to remove any colored resin residues originating from the previous coloring steps.

However, there are several disadvantages in chaining steps according to prior art as has just been described with reference to FIGS. 1 and 2. In particular, the surface of the fixed contact 3 is degraded. The aluminum surface of the fixed contact 3 is actually degraded by the action of aggressive solvents used during photolithographic development steps designed to remove parts of previously insolated colored resins for definition of the patterns of the colored filter elements 6, 7 and 8. This degradation of the aluminum surface is a very serious problem when making electrical connections at the fixed contact. Furthermore, the last stripping step consisting of cleaning the surface of the fixed contact with oxygen plasma tends to degrade the physical dimensions of micro-lenses.

Thus, processes have been developed to improve protection for the integrity of the aluminum surface of the fixed contact in the context described above, in which coloring steps are used for the formation of colored filter elements. In particular, one existing method of improvement consists of depositing a layer for protection of the surface of the fixed contact once the etching steps have been completed, to open the fixed contact, as described with reference to FIG. 1.

Thus, as shown in FIG. 3, after carrying out the etching steps of the fixed contact 3, an intermediate step consists of depositing a protection layer 11, for example made of nitride, oxide or oxinitride. The purpose of the protection layer 11 is to protect the surface of the fixed contact 3 while the process to make the colored filter elements is being carried out. Thus, once the protection layer 11 has been deposited, the colored filter elements 6, 7 and 8 are formed on the protection layer 11 as already described above with reference to FIG. 2, and the layer of planarizing resin 9 is deposited so as to cover the colored filter elements. With reference to FIG. 4, the part of the protection layer 11 covering the fixed contact 3 is then etched so as to open the hole 4 vertically in line with the fixed contact 3. Advantageously, the planarizing resin layer 9 in this case acts as an etching mask. Once the protection layer 11 has been opened above the fixed contact 3, the micro-lens resin layer is deposited and the micro-lenses 10 are formed on the planarizing resin 9 above the corresponding colored filter elements 6, 7 and 8.

However, although this process described with reference to FIGS. 3 and 4 is capable of protecting the integrity of the aluminum surface of the fixed contact 3, it is not fully satisfactory. It requires the use of additional steps in the manufacturing process for deposition of the nitride protection layer and for opening it, which has the disadvantage that it increases manufacturing cycle times and therefore the cost of the final component.

According what is needed is a method and system to overcome the problems and disadvantages of the prior art related to degradation of the aluminum surface of fixed contacts for a semiconductor color image sensor cell during the steps involved in making the colored filter elements, by making an improvement to protect the integrity of the aluminum surface of fixed contacts that is not excessively penalizing, particularly in terms of manufacturing costs.

SUMMARY OF THE INVENTION

The present invention provides to a process for making a semiconductor color image sensor cell designed to protect the surface of a fixed contact of the cell during implementation of photolithographic steps to define colored filter elements for the cell, which comprises a metal layer in which the fixed contact is defined, an anti-reflecting layer covering the metal layer and a passivation layer covering the assembly on which colored filter elements will be fitted, the process being characterized in that it comprises steps consisting of:—etching the passivation layer and stopping on the anti-reflecting layer so as to form a hole for the opening of the fixed contact;—forming at least one colored filter element on a region of the passivation layer, the anti-reflecting layer then acting as a protection layer for the surface of the fixed contact;—depositing a planarizing resin layer so as to cover the colored filter elements;—forming micro-lenses on the planarizing resin layer above the corresponding said colored filter elements;—and etching the anti-reflecting layer to open the fixed contact.

According to one variant, the cell comprises three colored filter elements formed one after the other on the passivation layer.

Preferably, the first colored filter element is a green filter element formed by application of a first layer of colored resin and definition of a pattern in this layer by exposure and photolithographic development.

Preferably, the second colored filter element is a blue filter element formed by application of a second layer of colored resin and definition of a pattern in this layer by exposure and photolithographic development.

Preferably, the third colored filter element is a red filter element formed by application of a third layer of colored resin and definition of a pattern in this layer by exposure and photolithographic development.

According to one embodiment, the formation of micro-lenses consists of a deposition of a resin layer, an exposure and a photolithographic development of the layer so as to obtain resin fixed contacts located immediately above the corresponding colored filter elements, and baking in order to make the fixed contacts convex to form micro-lenses.

According to one embodiment of the invention, the fixed contact is made of aluminum.

Advantageously, the anti-reflecting layer is made of titanium nitride.

BRIEF DESCRIPTION OF THE DRAWING

The subject matter, which is regarded as the invention, is particularly pointed out and distinctly claimed in the claims at the conclusion of the specification. The foregoing and other features, non-limiting examples and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
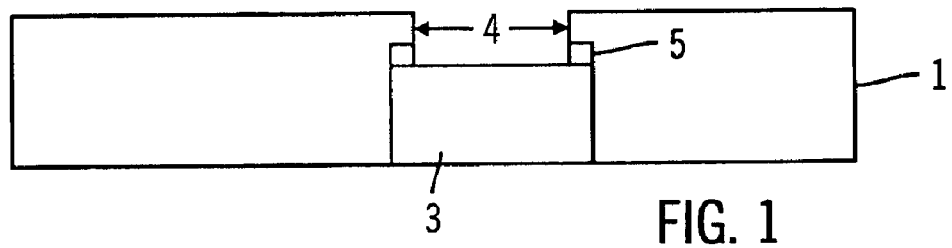
FIGS. 1 and 2 illustrate sequences of steps according to prior art used for the formation of a fixed contact and colored filter elements of a color image sensor cell.
Figure 2:
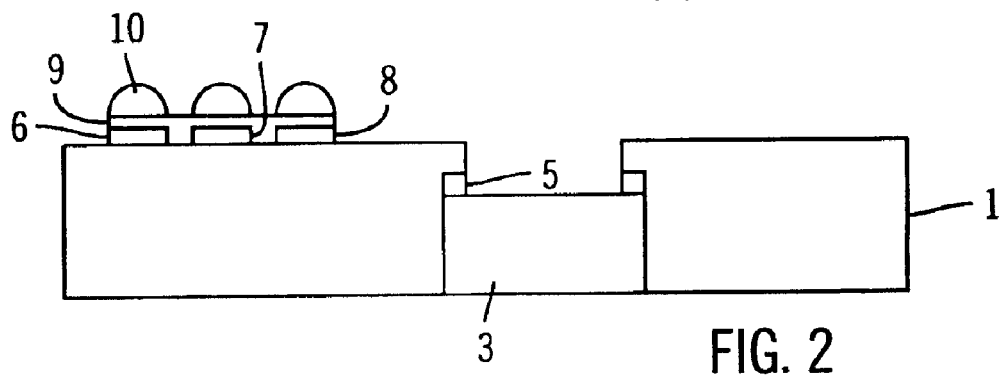
Figure 3:
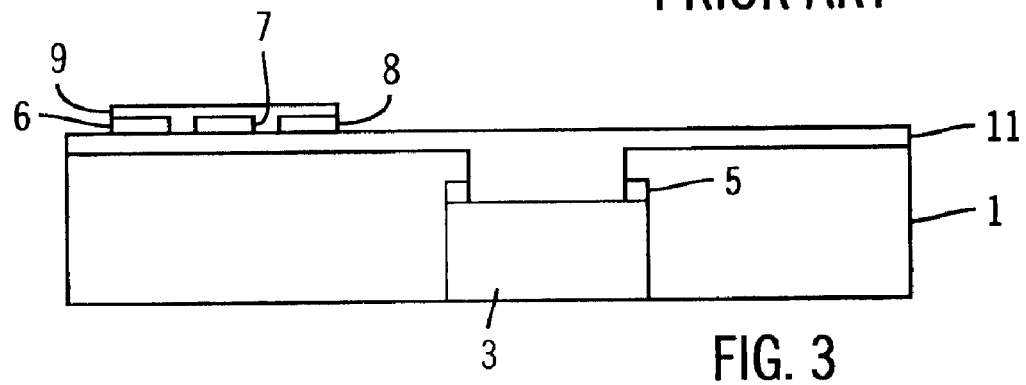
FIGS. 3 and 4 illustrate sequences of steps according to prior art for improvement of the protection of the surface integrity of the fixed contact during implementation of the coloring steps.
Figure 4:
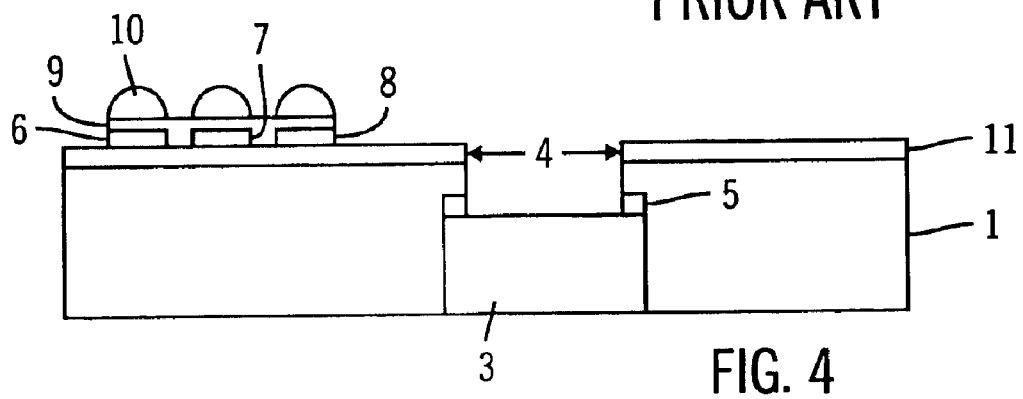
Figure 5:
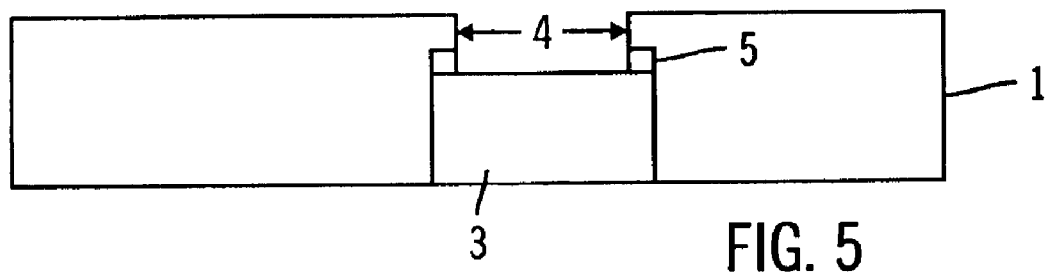
FIGS. 5 to 7 illustrate sequences of steps in the process according to this invention.

Turning to FIG. 5 shown is a fixed contact 3 preferably made of aluminum and is covered by the anti-reflecting layer 5, preferably made of titanium nitride. The fixed contact 3 is encased in the passivation oxide layer 1. The process according to this invention consists firstly of etching the passivation layer 1 stopping on the anti-reflection layer 5 covering the metal layer on which the fixed contact 3 is defined, so as to form the hole 4 vertically in line with the fixed contact 3. The fixed contact 3 is opened in the same way as in existing processes, except that at this stage, only the first step in etching the fixed contact 3 consisting of etching the passivation oxide layer 1 is applied. Therefore the anti-reflection layer 5 made of titanium nitride designed to be removed is not etched after etching the passivation layer 1 so as to advantageously protect the aluminum surface of the fixed contact 3 during implementation of the coloring steps of the color image sensor cell.

Figure 6:
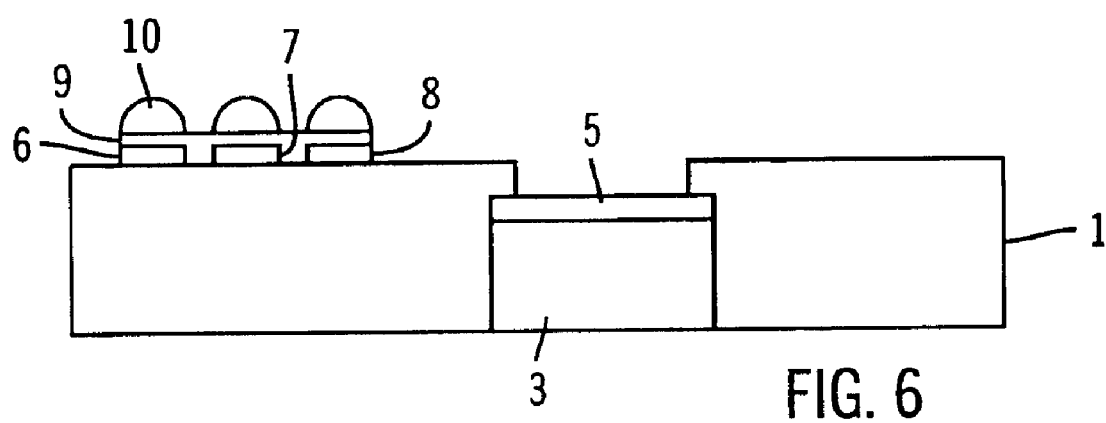

The coloring steps consisting of forming at least one colored filter element on a region of the passivation layer of the cell are described with reference to FIG. 6. According to one preferred embodiment, three colored filter elements 6, 7 and 8 are formed in sequence on the passivation layer 1. The first colored filter element 6 is preferably a green filter element and is formed by application of a first layer of photosensitive colored resin, and its pattern is defined in the first colored resin layer by photo-etching using conventional exposure and photolithographic development procedures applied to the first colored resin layer. After definition of the first colored filter element 6, a second colored filter element 7, preferably blue, and a third colored filter element 8, preferably red, are made in sequence on the passivation layer 1. Similarly, the second colored filter element 7 is formed by application of a second photosensitive colored resin layer and its pattern is defined in the second colored resin layer by the use of conventional exposure and photolithographic development procedures applied to the second colored resin layer. The colored filter element 8 is defined by applying the same sequences of steps described above for the definition of the colored filter elements 6 and 7.

The successive developments for the first, second and third colored resin layers for the definition of the corresponding patters in the first, second and third colored filter elements 6, 7 and 8, require the use of aggressive chemical solvents to develop the colored resins. Due to the presence of the titanium nitride layer 5 covering the aluminum surface of the fixed contact 3, the surface is advantageously protected from attack by colored resin developers. Thus, with the process according to this invention, the aluminum surface of the fixed contact is not degraded during the manufacturing process of the colored filter elements. This result is obtained without it being necessary to carry out additional steps specifically designed to protect the surface of the fixed contact, since this protection is advantageously achieved using the properties of an existing layer, in fact the titanium nitride anti-reflecting layer that was not initially provided for this purpose.

Once the colored filter elements 6, 7 and 8 have been made, a planarizing resin layer 9 is formed so as to cover the three colored filter elements. This planarizing layer 9 is formed by the application of deposition, exposure and photolithographic development steps on the planarizing resin such that the layer 9 obtained covers the three colored elements 6, 7 and 8.

The step for the formation of micro-lenses 10 on the planarizing resin layer 9 above the colored elements 6, 7 and 8 is then done as described above. This is done by depositing a new resin layer, called the micro-lens resin designed for the formation of micro-lenses 10 themselves. The parts of the layer of micro-lens resin that cover the regions of the cell not covered by the colored elements 6, 7 and 8, and particularly the region of the fixed contact 3 covered by the anti-reflecting layer 5 made of titanium nitride, then have to be insolated and then removed by chemical development, before carrying out the step for actual formation of the micro-lenses 10 by baking.

Due to its optical properties, and particularly reflection, of titanium nitride that are different from the corresponding properties of aluminum forming the fixed contact, it is easier to insolate the micro-lens resin layer that is to be removed. Thus, one advantage offered by the process according to this invention is that, unlike processes according to prior art, it is no longer useful to overexpose the micro-lens resin area located above the fixed contact 3 as described above. Therefore with the process according to the invention, only a single photolithographic exposure step is necessary to correctly insolate all parts of the micro-lens resin layer that have to be removed, including the part of the micro-lens resin layer located above the fixed contact 3.

Figure 7:
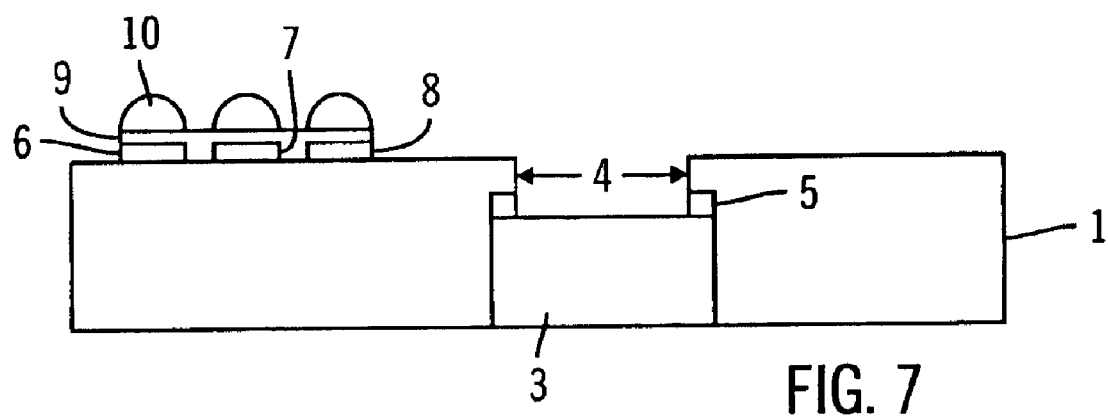

Finally, the last step in the process is described with reference to FIG. 7, that consists of etching the anti-reflecting layer 5 made of titanium nitride so as to open the fixed contact 3. This is done by etching the fixed contact 3 continuing from the step at which it was stopped, in other words after etching the passivation oxide 1. The step in which the anti-reflecting layer 5 is etched is then applied, followed by the aluminum over etching step terminating etching of the fixed contact and consisting of etching any residues that may remain on the aluminum surface of the fixed contact 3.

Another advantage of the process according to the invention is that it avoids the "descum" step that consists of cleaning the surface of the fixed contact with an oxygen plasma at the end of the process in order to strip the surface of the fixed contact to remove any colored resin residues originating from the coloring steps. This step to strip any colored resin residues is actually carried out at the same time as the etching step of the anti-reflecting layer made of titanium nitride covering the fixed contact. Furthermore, and advantageously, the step in which the anti-reflecting layer made of titanium nitride covering the surface of the fixed contact is significantly less degrading for micro-lenses than the stripping step using oxygen plasma.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for making a semiconductor color image sensor cell while protecting a surface of a fixed contact, the method comprising:

defining a fixed contact by etching a passivation layer and stopping on an anti-reflecting layer so as to form a hole for an opening of the fixed contact;

forming at least one colored filter element on a region of the passivation layer, whereby the anti-reflecting layer acts as a protection layer for a surface of the fixed contact;

depositing a planarizing resin layer so as to cover the colored filter elements;

forming micro-lenses on the planarizing resin layer above the colored filter elements; and etching the anti-reflecting layer to open the fixed contact.

2. The process according to claim 1, wherein the forming at least one colored filter elements includes forming three colored filter elements formed in succession on the passivation layer.

3. The process according to claim 2, wherein the forming at least one colored filter elements includes forming a first colored filter element of the three colored filter elements which is a green filter element formed by application of a first layer of colored resin and definition of a pattern in the first layer by exposure and photolithographic development.

4. The process according to claim 2, wherein the forming at least one colored filter elements includes forming a second colored filter element of the three colored filter elements which is a blue filter element formed by application of a second layer of colored resin and definition of a pattern in the second layer by exposure and photolithographic development.

5. The process according to claim 2, wherein the forming at least one colored filter elements includes forming a third colored filter element of the three colored filter elements which is a red filter element formed by application of a third layer of colored resin and definition of a pattern in the third layer by exposure and photolithographic development.

6. The process according to claim 1, wherein the forming micro-lenses includes deposition of a resin layer, an exposure and a photolithographic development of the resin layer so as to obtain resin fixed contacts located immediately above the colored filter elements, and baking in order to make the fixed contacts convex to form the micro-lenses.

7. The process according to claim 2, wherein the forming micro-lenses includes deposition of a resin layer, an exposure and a photolithographic development of the resin layer so as to obtain resin fixed contacts located immediately above the colored filter elements, and baking in order to make the fixed contacts convex to form the micro-lenses.

8. The process according to claim 3, wherein the forming micro-lenses includes deposition of a resin layer, an exposure and a photolithographic development of the resin layer so as to obtain resin fixed contacts located immediately above the colored filter elements, and baking in order to make the fixed contacts convex to form the micro-lenses.

9. The process according to claim 4, wherein the forming micro-lenses includes deposition of a resin layer, an exposure and a photolithographic development of the resin layer so as to obtain resin fixed contacts located immediately above the colored filter elements, and baking in order to make the fixed contacts convex to form the micro-lenses.

10. The process according to claim 5, wherein the forming micro-lenses includes deposition of a resin layer, an exposure and a photolithographic development of the resin layer so as to obtain resin fixed contacts located immediately above the colored filter elements, and baking in order to make the fixed contacts convex to form the micro-lenses.

11. The process according to claim 1, wherein in the defining a fixed contact includes defining a fixed contact of aluminum.

12. The process according to claim 2, wherein in the defining a fixed contact includes defining a fixed contact of aluminum.

13. The process according to claim 3, wherein in the defining a fixed contact includes defining a fixed contact of aluminum.

14. The process according to claim 4, wherein in the defining a fixed contact includes defining a fixed contact of aluminum.

15. The process according to claim 5, wherein in the defining a fixed contact includes defining a fixed contact of aluminum.

16. The process according to claim 10, wherein in the defining a fixed contact includes defining a fixed contact of aluminum.

17. The process according to claim 1, wherein the defining a fixed contact by etching a passivation layer and stopping on the anti-reflecting layer includes an anti-reflecting layer made of titanium nitride.

18. The process according to claim 2, wherein the defining a fixed contact by etching a passivation layer and stopping on the anti-reflecting layer includes an anti-reflecting layer made of titanium nitride.

19. The process according to claim 3, wherein the defining a fixed contact by etching a passivation layer and stopping on the anti-reflecting layer includes an anti-reflecting layer made of titanium nitride.

20. The process according to claim 4, wherein the defining a fixed contact by etching a passivation layer and stopping on the anti-reflecting layer includes an anti-reflecting layer made of titanium nitride.

21. The process according to claim 5, wherein the defining a fixed contact by etching a passivation layer and stopping on the anti-reflecting layer includes an anti-reflecting layer made of titanium nitride.

22. The process according to claim 15, wherein the defining a fixed contact by etching a passivation layer and stopping on the anti-reflecting layer includes an anti-reflecting layer made of titanium nitride.

* * * * *